United States Patent
McIlquham et al.

(10) Patent No.: US 8,664,537 B2
(45) Date of Patent: Mar. 4, 2014

(54) METHOD AND APPARATUS FOR REDUCING SIGNAL NOISE

(75) Inventors: Kenneth McIlquham, Wixom, MI (US); Niyant Patel, Southfield, MI (US)

(73) Assignee: TRW Automotive U.S. LLC, Livonia, MI (US)

( * ) Notice: Subject to any disclaimer, the term of this patent is extended or adjusted under 35 U.S.C. 154(b) by 171 days.

(21) Appl. No.: 12/643,129

(22) Filed: Dec. 21, 2009

(65) Prior Publication Data

US 2011/0147070 A1 Jun. 23, 2011

(51) Int. Cl.
*H05K 1/16* (2006.01)

(52) U.S. Cl.
USPC ............. 174/260; 714/255; 714/262; 29/830; 29/852

(58) Field of Classification Search
USPC ............ 174/250, 255, 261–262, 266; 29/825, 29/846; 361/761–762
See application file for complete search history.

(56) References Cited

U.S. PATENT DOCUMENTS

| | | | |
|---|---|---|---|
| 4,904,968 A | 2/1990 | Theus | |
| 5,089,881 A * | 2/1992 | Panicker | 257/691 |
| 6,573,590 B1 * | 6/2003 | Radu et al. | 257/660 |
| 6,678,145 B2 * | 1/2004 | Naito et al. | 361/308.1 |
| 6,815,812 B2 * | 11/2004 | Ali et al. | 257/691 |
| 7,030,712 B2 | 4/2006 | Brunette et al. | |
| 7,154,356 B2 | 12/2006 | Brunette et al. | |
| 7,355,836 B2 * | 4/2008 | Radhakrishnan et al. | 361/306.2 |
| 7,378,602 B2 * | 5/2008 | Ikeda | 174/262 |
| 7,742,276 B2 * | 6/2010 | Hsu et al. | 361/306.2 |
| 7,851,709 B2 * | 12/2010 | Cheng | 174/265 |
| 7,884,458 B2 * | 2/2011 | Kang et al. | 257/686 |
| 7,905,014 B2 * | 3/2011 | Ikeda | 29/852 |
| 7,977,582 B2 * | 7/2011 | Clark et al. | 174/262 |
| 2003/0047348 A1 | 3/2003 | Jessep et al. | |
| 2006/0076160 A1 | 4/2006 | Hsu et al. | |
| 2007/0221405 A1 * | 9/2007 | Cheng | 174/265 |
| 2009/0002952 A1 | 1/2009 | Mesmer et al. | |
| 2009/0021323 A1 * | 1/2009 | Lee | 333/12 |
| 2009/0188712 A1 * | 7/2009 | Clark et al. | 174/378 |

OTHER PUBLICATIONS

Ye et al., "The EMI Benefits of Ground Plane Stitching in Multi-Layer Power Bus Stacks", *IEEE Trans. Electromag. Comp.* 2000, pp. 833-838.

* cited by examiner

*Primary Examiner* — Ishwarbhai B Patel
(74) *Attorney, Agent, or Firm* — Tarolli, Sundheim, Covell & Tummino LLP

(57) ABSTRACT

A printed circuit board having at least two spaced apart conductive planes. A plurality of vias extend between the two spaced apart conductive planes with the vias being electrically connected to a selected one of the two conductive planes in an alternating pattern. A differential electrical signal is connectable to the conductive planes so that the vias are alternately energized by the differential electrical signal when the differential electrical signal is connected to the conductive planes.

2 Claims, 2 Drawing Sheets

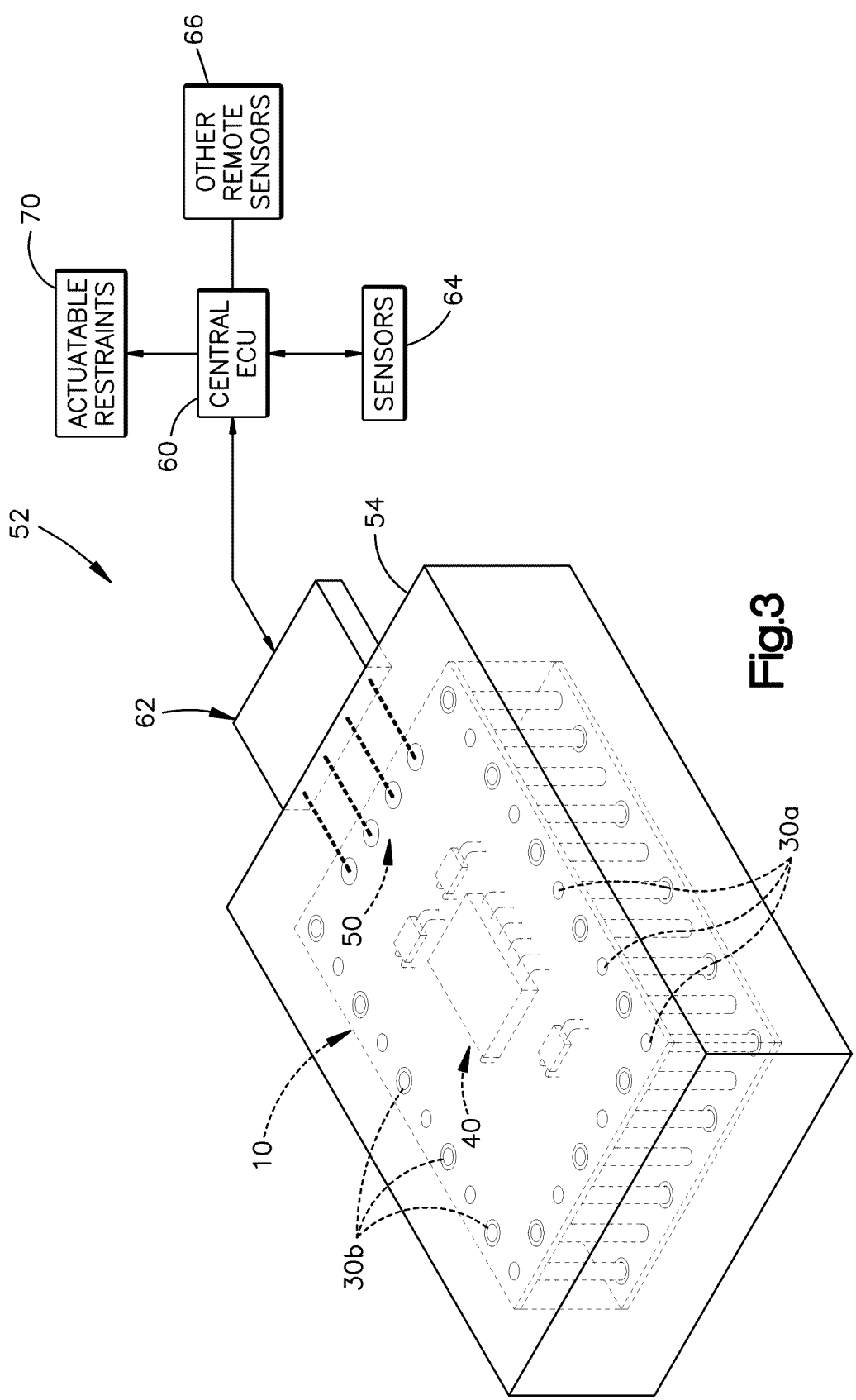

METHOD AND APPARATUS FOR REDUCING SIGNAL NOISE

TECHNICAL FIELD

The present invention is directed to electrical signal noise reduction and is more particularly direct to a method and apparatus for reducing electrical signal noise transmissions that may be produced from circuitry on a printed circuit board.

BACKGROUND

Electrical signal noise is any unwanted electrical or magnetic interference that affects other electrical signals and/or corrupts electrical data. There are many causes for electrical signal noise. The different types of electrical noise include conducted emissions, radiated emissions, conducted susceptibility, and radiated susceptibility. Electrical signal noise typically occurs over a wide frequency spectrum resulting from alternating currents and voltages. Over the years, there have been many proposed methods and circuit arrangements aimed at reducing electrical signal noise in electrical systems.

U.S. Pat. No. 4,904,968 appears to describe a particular circuit board configuration for reducing signal distortions that includes use of a ground plane.

A via is a hole, lined with a conductive material, that extends from one layer of a printed circuit board to a different layer. The via can be used to simply make a connection between desired layers of the printed circuit board or can be used to provide an electrical connection between a desired layer and a mounted electrical component. Vias can be formed by drilling or etching through the selected dielectric layer(s) and then plating the hole with a conductive material so as to provide the desired electrical connection between the associated layer(s) and circuit component.

Vias, themselves, can lead to noise problems in printed circuit boards where the vias carry electrical signals. In printed circuit boards having connecting vias, stitching capacitors have been introduced between conductive and ground planes for noise reduction. One example of stitching capacitors is found in U.S. patent publication 2006/0076160A1.

U.S. Pat. No. 7,154,356 appears to describe a radio frequency ("RF") circuit board topology having inter-connective layers including a signal conductor via surrounded by a plurality of ground vias so as to affect the overall characteristic impedance of the interconnection structure.

In an IEEE paper entitled "The EMI (electromagnetic interference) benefits of ground plane stitching in multi-layer conductive bus stacks" by Ye et al., (Paper No. 0-7803-5677-2/00 pages 833-838, 2000), there is described a printed circuit board arrangement having multiple ground planes. The ground planes are stitched together at the periphery of the board using closely spaced vias so as to reduce the level of radiation from other EMI fields. The paper focuses on the impact of ground plane stitching on radiated EMI.

In a vehicle environment, electrical signal noise produced by electrical circuitry can be disruptive to other electrical and electronic devices of the vehicle such as the vehicle's radio.

SUMMARY OF THE INVENTION

In accordance with the present invention, noise emissions from a printed circuit board is reduced by providing stitching vias near the outer periphery of the printed circuit board and alternately connecting the stitched vias to a differential signal.

In accordance with one example embodiment of the present invention, an apparatus is provided that includes a printed circuit board having at least two spaced apart conductive planes. A plurality of vias extends between the two spaced apart conductive planes with the vias being electrically connected to a selected one of the two conductive planes in an alternating pattern. A differential electrical signal is connectable to the conductive planes so that the vias are alternately energized by the differential electrical signal when the differential electrical signal is connected to the conductive planes.

In accordance with another example embodiment, a printed circuit board comprises a non-conductive substrate and at least two spaced apart conductors. A plurality of vias extend through the non-conductive substrate and are electrically connected to a selected one of the two conductor in an alternating pattern. A differential electrical signal is connectable to the conductors so that the vias are alternately energized with the differential electrical signal.

In accordance with another example embodiment of the present invention, a method is provided for reducing electrical signal noise in an electrical system comprising the steps of providing a printed circuit board, fabricating two spaced apart conductive planes on the printed circuit board, extending a plurality of vias between the two spaced apart conductive planes, electrically connecting the vias to a selected one of the two conductive planes in an alternating pattern, and connecting a differential electrical signal to the conductive planes so that the vias are alternately energized by the differential electrical signal.

BRIEF DESCRIPTION OF THE DRAWINGS

The foregoing and other features and advantages of the present invention will become apparent to those skilled in the art to which the present invention relates upon reading the following description with reference to the accompanying drawings, in which:

FIG. 3 is a schematic block diagram of the printed circuit board of FIG. 1 used in a vehicle crash detection system.

DESCRIPTION OF PREFERRED EMBODIMENT

Figure 1:
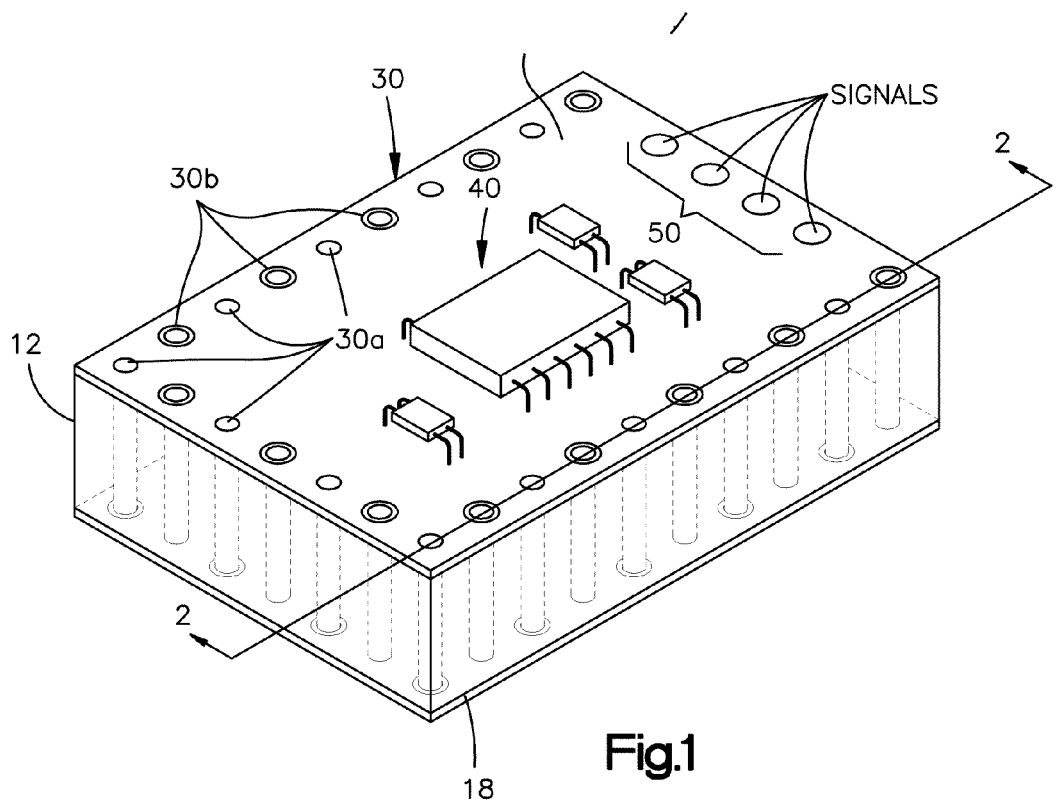
FIG. 1 is a perspective view of a printed circuit board made in accordance with an example embodiment of the present invention.
Figure 2:
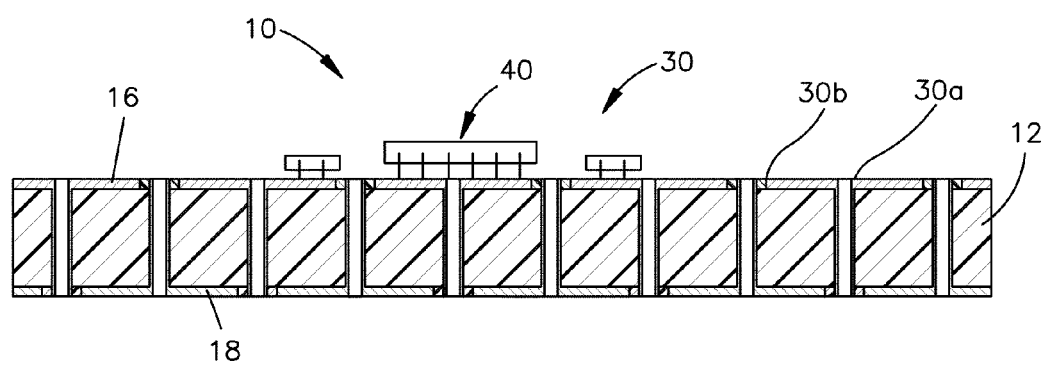
FIG. 2 is a cross-sectional view taken along line 2-2 in FIG. 1.

Referring to FIGS. 1 and 2, a printed circuit board ("PCB") 10, made in accordance with one example of the present invention, is shown. The PCB could have any number of desired layers. The PCB 10 includes a dielectric substrate 12 in the form of a plane having a rectangular shape. Any shape substrate could be used. The dielectric substrate 12 has a first conductive plane 16 formed on one side of the dielectric substrate 12 and a second conductive plane 18 formed on the opposite side of the dielectric substrate 12.

A plurality of vias 30 are formed near the outer periphery of the PCB 10 and are alternately connected to the first conductive plane 16 or to the second conductive plane 18. Specifically, alternately stitched vias 30a are electrically connected to the first conductive plane 16 and extend toward but are not electrically connected to second conductive plane 18. Alternately stitched vias 30b are electrically connected to the second conductive plane 18 and extend toward but are not electrically connected to first conductive plane 16. In one example embodiment, the length of the alternately stitched vias 30a and 30b are sufficient to reach the opposed conductive plane.

In accordance with an example embodiment, the conductive planes 16, 18 are connected to a differential electrical signal so that a voltage differential exists between the conductive planes 16, 18 and, in turn, the alternating stitched vias 30a and 30b. The differential electrical signal can provide the electrical power for the circuitry 40 mounted on the PCB 10 and can also provide signals for the circuitry 40.

The circuitry 40 is interconnected in accordance with desired electrical functions of the system by traces etched in one or both of the conductive planes 16, 18. Electrical connections are made to the conductive planes 16, 18, and, any inputs or outputs of the circuitry 40 on the PCB 10 via compliant pins 50.

It has been found that the arrangement of alternately connecting the differential signals to the stitched vias located around the periphery of the PCB 10, reduces electrical noise emissions that may otherwise occur.

Referring to FIG. 3, a specific example application of the printed circuit board 10 in use as part of an actuatable occupant restraint system 52 is shown. The printed circuit board 10, made in accordance with the present invention, is mounted within a housing that is, in turn, mounted at a remote sensing location in a vehicle (not shown), such as in the vehicle doors. The circuitry 40 in this example embodiment is adapted for detection of a vehicle crash condition and may include an accelerometer and necessary processing circuitry for this purpose. A central ECU (electronic control unit) 60 located within the vehicle cabin, e.g., central cabin location, is connected to the printed circuit board 10 and its associated circuitry 40 through a connector 62 plugged into the housing 54 and electrically connected to the compliant pins 50. Other central crash condition sensors 64 and other remote crash condition sensors 66 may also be connected to the central ECU 60. The ECU monitors the sensors and determines if a deployment vehicle crash condition is occurring and, in response to the determination, controls actuatable restraints 70. A differential signal is applied to the PCB 10 from the central ECU 60 that is alternately connected to the stitched vias 30a and 30b. This arrangement reduces electrical noise emissions that could affect other vehicle electrical systems, e.g., the vehicle radio.

From the above description of the invention, those skilled in the art will perceive improvements, changes and modifications. Such improvements, changes and modifications within the skill of the art are intended to be covered by the appended claims.

Having described the invention, the following is claimed:

1. An apparatus comprising:
   a printed circuit board for carrying circuitry, said printed circuit board including a dielectric substrate having a first conductive plane on a first side of the dielectric substrate and a second conductive plane on a second side of the dielectric substrate, said dielectric substrate maintaining said first conductive plane and said second conductive plane spaced apart;
   a plurality of alternately stitched vias located near a portion of an outer periphery of the printed circuit board, each one of said plurality of alternately stitched vias being electrically connected to only one of the first conductive plane and the second conductive plane in an alternating pattern and fully extending between said first conductive plane and said second conductive plane; and
   a source having a differential electrical signal connected to said first conductive plane and said second conductive plane so as to have a voltage differential between the first conductive plane and the second conductive plane and alternately energize said plurality of alternately stitched vias and thereby reduce electrical signal noise emissions from the circuitry carried on the printed circuit board.

2. A method for reducing electrical signal noise in an electrical system comprising the steps of:
   mounting circuitry to a printed circuit board having a dielectric substrate, a first conductive plane on a first side of the dielectric substrate, and a second conductive plane on a second side of the dielectric substrate, the dielectric substrate maintaining the first conductive plane and the second conductive plane spaced apart;
   fully extending a plurality of alternately stitched vias between the first conductive plane and the second conductive plane and near a portion of an outer periphery of the printed circuit board;
   electrically connecting the plurality of alternately stitched vias to only one of the first conductive plane and the second conductive plane in an alternating pattern;
   providing a source having a differential electrical signal; and
   connecting the differential electrical signal provided from the source to the first conductive plane and the second conductive plane so as to have a voltage differential between the first conductive plane and the second conductive plane and alternately energize the plurality of alternately stitched vias and thereby reduce electrical signal noise emissions from the circuitry mounted on the printed circuit board.

* * * * *